United States Patent [19]
Abbiate et al.

[11] Patent Number: 5,461,641
[45] Date of Patent: Oct. 24, 1995

[54] DECIMATION FILTER FOR A SIGMA-DELTA CONVERTER AND A/D CONVERTER USING THE SAME

[75] Inventors: Jean-Claude Abbiate, La Gaude; Alain Blanc, Vence; Patrick Jeanniot, La Gaude; Gerard Richter, Saint-Jeannet, all of France

[73] Assignee: International Business Machines Corporation, Armonk, N.Y.

[21] Appl. No.: 981,157

[22] Filed: Nov. 23, 1992

[30] Foreign Application Priority Data

Jul. 10, 1992 [EP] European Pat. Off. .............. 92480099

[51] Int. Cl.$^6$ ................................................ H04B 14/04
[52] U.S. Cl. ........................ 375/243; 375/254; 341/143; 364/724.04; 364/724.1
[58] Field of Search ...................... 375/25, 26, 34, 375/242, 243, 254, 319, 350, 351; 364/724.1, 724.01, 724.04; 341/143

[56] References Cited

U.S. PATENT DOCUMENTS

| | | | |
|---|---|---|---|
| 4,231,101 | 10/1980 | Eggermont | 375/26 |
| 4,590,458 | 5/1986 | Evans et al. | 375/26 |
| 4,943,807 | 7/1990 | Early et al. | 341/120 |
| 5,220,327 | 6/1993 | Abbiate et al. | 364/724.1 |
| 5,226,001 | 7/1993 | Garverick | 364/724.1 |
| 5,258,939 | 11/1993 | Johnstone et al. | 364/724.1 |
| 5,276,708 | 1/1994 | Heitman | 375/34 |

OTHER PUBLICATIONS

IEEE Int. Solid State Circuits Conf. vol. 34, 2–91, pp. 238–239–320; Lerch et al.
IEEE Journal of Solid–State Circuits, vol. 26, 12–91; pp. 1951–1957; Lakshmikumar et al.
ICASSP 85, IEEE Int. Conf. on Acoustics, Speech & Signal Processing; Mar. 1985; pp. 36.2.1–36.2.4; Hanafy Meleis et al.

Primary Examiner—Stephen Chin
Assistant Examiner—Amanda T. Le
Attorney, Agent, or Firm—Joscelyn G. Cockburn

[57] ABSTRACT

A Decimation filter for converting a train of sigma-delta pulses S(i) in synchronism with a sigma-delta clock (fs) into a train of Pulse Coded Modulation (PCM) samples in accordance with the formula $$\sum_{n=0}^{3N-1} C(n) \times S(i+n)$$

where Cn is the sequence of the coefficients of the decimation filter which corresponds to a determined decimation factor, and the PCM samples being processed by a Digital Signal Processor (DSP). The decimation filter includes a device for storing a digital value representative of the DC component introduced during the sigma-delta coding process, with the digital value being computing by the DSP processor during an initialization phase. The decimation filter further includes a device operating after the latter initialization phase for subtracting the stored digital value from each of the PCM samples so that the resulting sequence of PCM samples appears free of any DC component introduced during the sigma-delta coding. This accurate DC component suppression is achieved without necessitating the use of additional digital signal processor resources from the processor. Preferably, the decimation filter comprises a device for detecting a saturation occurring in the computing of the PCM sample, and responsive to the saturation detection, for transmitting a predetermined PCM sample to the DSP processor.

9 Claims, 7 Drawing Sheets

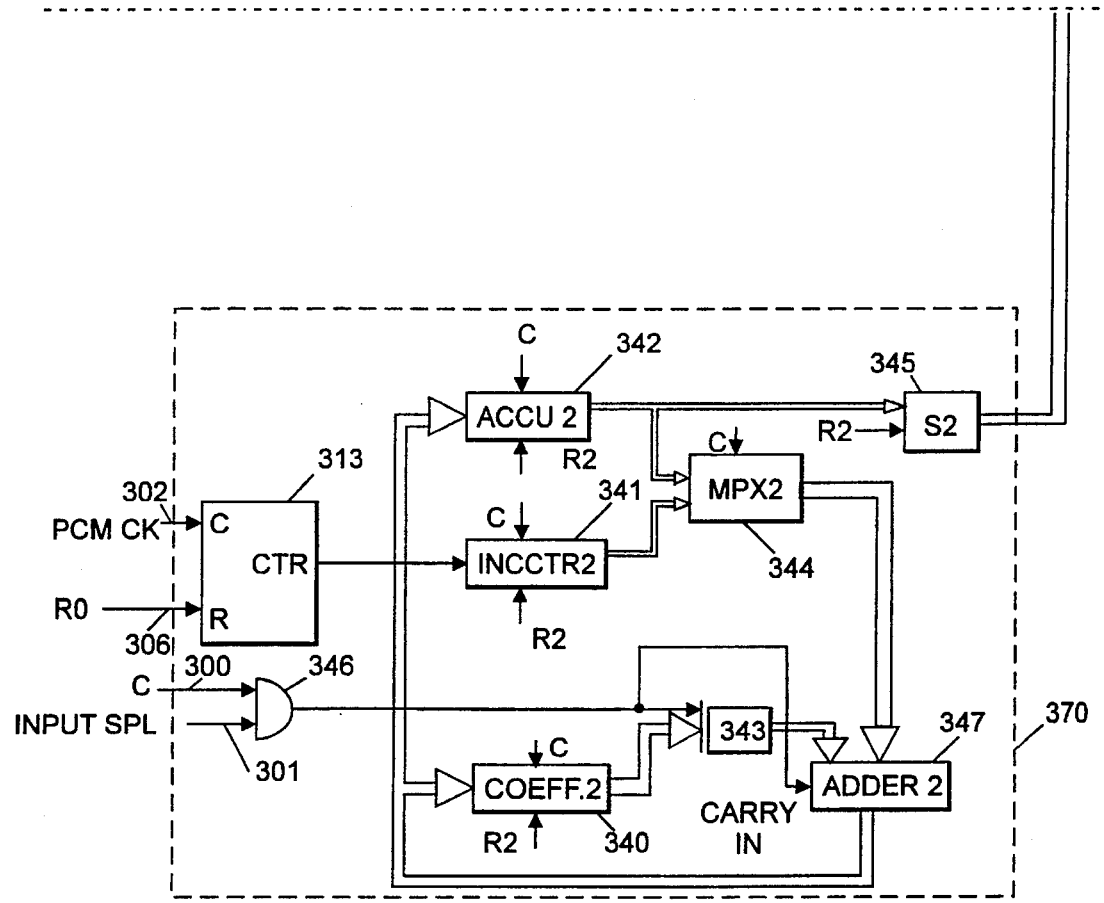

DECIMATION FILTER FOR A SIGMA-DELTA CONVERTER AND A/D CONVERTER USING THE SAME

TECHNICAL FIELD OF THE INVENTION

This invention relates to digital decimation and filtering devices and particularly to a decimation filter for converting a train of sigma-delta pulses into a corresponding train of Pulse Coded Modulation samples.

BACKGROUND ART

The sigma-delta technique is of great interest for realizing linear, accurate and simple analog-to-digital converters. Sigma-delta coders and decoders generally require the use of decimation circuits necessitating a great number of electronic components. For that reason, decimation circuits are embodied by means of Very Large Scale Integrated Technology (VLSI) components.

FIG. 1 shows the traditional basic structure of an analog-to-digital converter which uses a sigma-delta converter (130) for converting an analog input signal existing on a lead 110 in a train of sigma-delta pulses on a lead 120. The train of sigma-delta pulse comprising a high level of out-of-band quantization noise is then entered into a decimation filter 170 for converting the sigma-delta pulses into a sequence of Pulse Coded Modulation (PCM) samples on lead 140. For that purpose, decimation circuit 170 includes a low-pass digital filter 150 for suppressing the above out-of-band quantization and for avoiding in-band aliasing during the decimation process. Decimation circuit 170 also includes the specific decimation element which samples down the output signal of low-pass filter. This is simply achieved by taking one PCM sample over N samples. N is called the decimation factor of the process.

FIG. 2 illustrates a traditional simple-loop sigma-delta converter which is based on an operational amplifier 214 and a D_latch 215. The signal to be coded is entered, after an appropriate suppression of the DC component existing on the analog signal by means of a capacitor 210, in an integrator based on OA 214, resistor 211 and capacitor 213. The output of OA 214 is transmitted to the D_latch 215, which non inverting output is transmitted back to OA 214. Thus D_latch 215 generates, at the rate of a sigma-delta clock existing on its clock input lead, a train of sigma-delta pulses which average voltage value corresponds to the analog signal to be converted. The non inverting input of OA 214 is generally connected to a reference voltage Vref which is fixed at a value being equal to $(+V+0\ V)/2$, with $+V$ and $0\ V$ being the power supply voltages of D-latch 215. However, it appears practically impossible to have a value Vref being strictly equal to the ideal value $(+V+-V)/2$ and a difference of at least some millivolts still exists. This difference results in a DC component appearing in the codage at the output of latch 215 which disturbs the further signal processing operations which are carried out on the signal. Indeed, the effect of a DC component in the sigma-delta coding process appears as a non-linear distortion which spoils the further linear digital signal processing mechanisms which are used in telecommunication equipments, such as Data Circuit Terminating Equipments (DCE), equalization or the clock recovery processing systems.

Known solutions for suppressing the above DC components are based on an additional analog circuit which is connected to the positive input of OA 214, introducing a feedback value of the sigma-delta pulses so that to compensate for the DC component therein included. This solution appears however limited since it only achieves rejection rates about 40 dB approximately.

Another solution for the compensation of the DC component which is introduced during the sigma-delta pulses coding consists in using during the further digital signal processing operations carried out by the DSP processor a specific non-linear algorithm designed to handle this DC component. This solution appears much more accurate but unfortunately entails a substantial drawback since that algorithm would necessitate non-negligible digital signal processing resources from the DSP processor. Indeed, when the oversampling frequency increases, the digital resources requiring for such an algorithm tends to become high. For instance, in the case of a base-band or digital modem operating at a bit frequency of 72 kbps, and also with the assumption of an oversampling frequency of 144 Khz with a DSP operating at a 15 MHz rate, it appears that only about 100 elementary cycles of the digital processor are available for the processing of one given sample. Therefore, an additional algorithm for suppressing the DC component, although only requiring a few elementary cycles from the DSP processor, would however use-few percent of the whole digital processing resources.

SUMMARY OF THE INVENTION

The problem to be solved by the object of the present invention is to accurately suppress the DC component existing in the sigma-delta pulse train prior to its further processing by a digital signal processor so that no additional processing resources are required from the latter.

This problem is solved by DC component suppression mechanism according to the present invention which is located within the decimation circuit which includes a register which is loaded during an initialization period with a digital value corresponding to the average value of the DC component which is computed by the DSP processor, and a subtracting circuit for directly subtracting the value stored into the register from the PCM words before the latter are entered into the digital processor. Therefore, the computed PCM samples appear free of any DC component which might have been introduced during the sigma-delta coding. That DC compensation is accurate and does not necessitate additional digital signal processing resources from the DSP processor during the operative phase following the initialization period. Preferably, the decimation filter comprises means (406) for detecting a saturation occurring in the computing of the PCM sample, and responsive to said saturation detection, for transmitting a predetermined PCM sample to said DSP processor corresponding to the minimum or maximum value of the PCM sample that the decimation filter is capable of computing.

DESCRIPTION OF THE PREFERRED EMBODIMENT OF THE INVENTION

Figure 1:
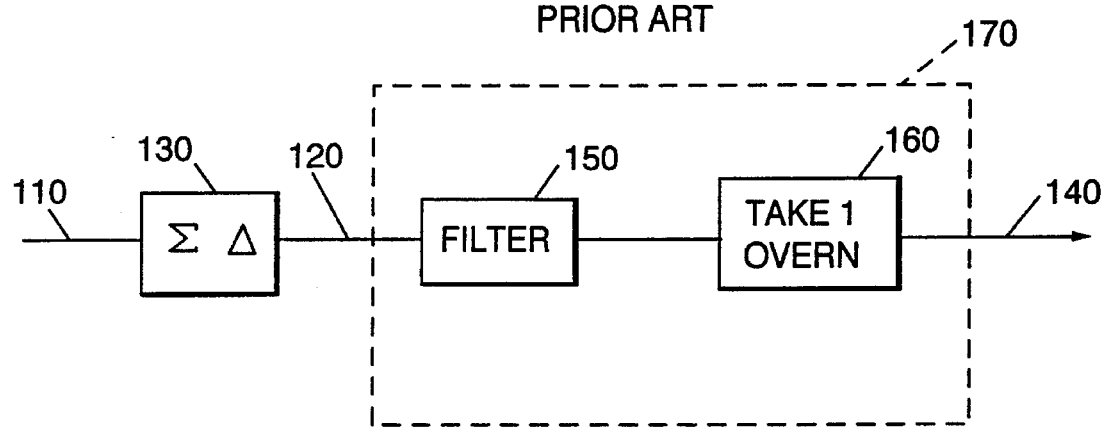
FIG. 1 shows the basic structure of a A/D converter using a sigma-delta coder which could incorporate the circuit according to the invention.
Figure 2:
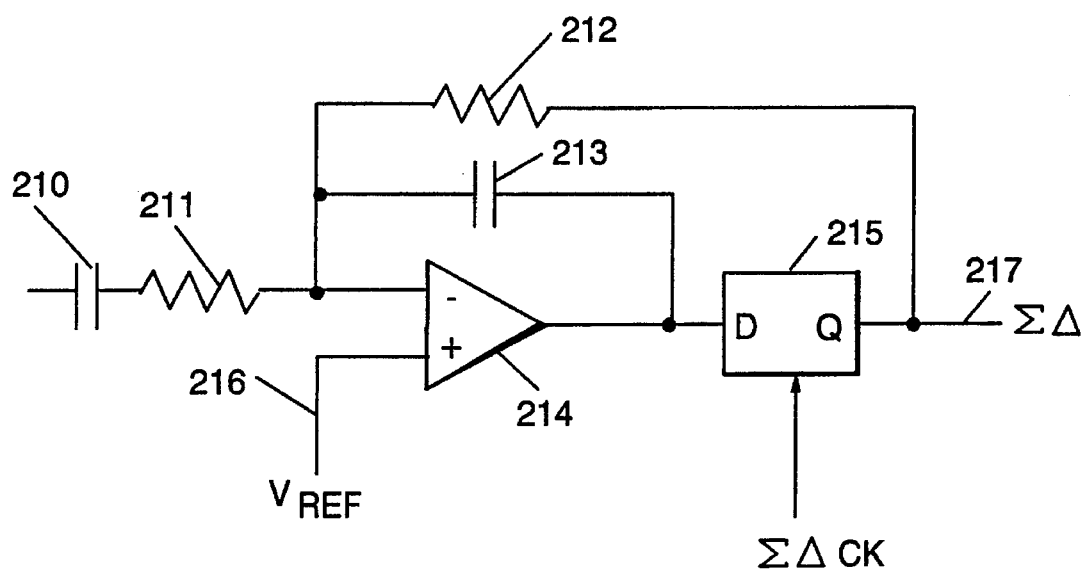
FIG. 2 illustrates a known simple loop sigma-delta converter.
Figure 3A:
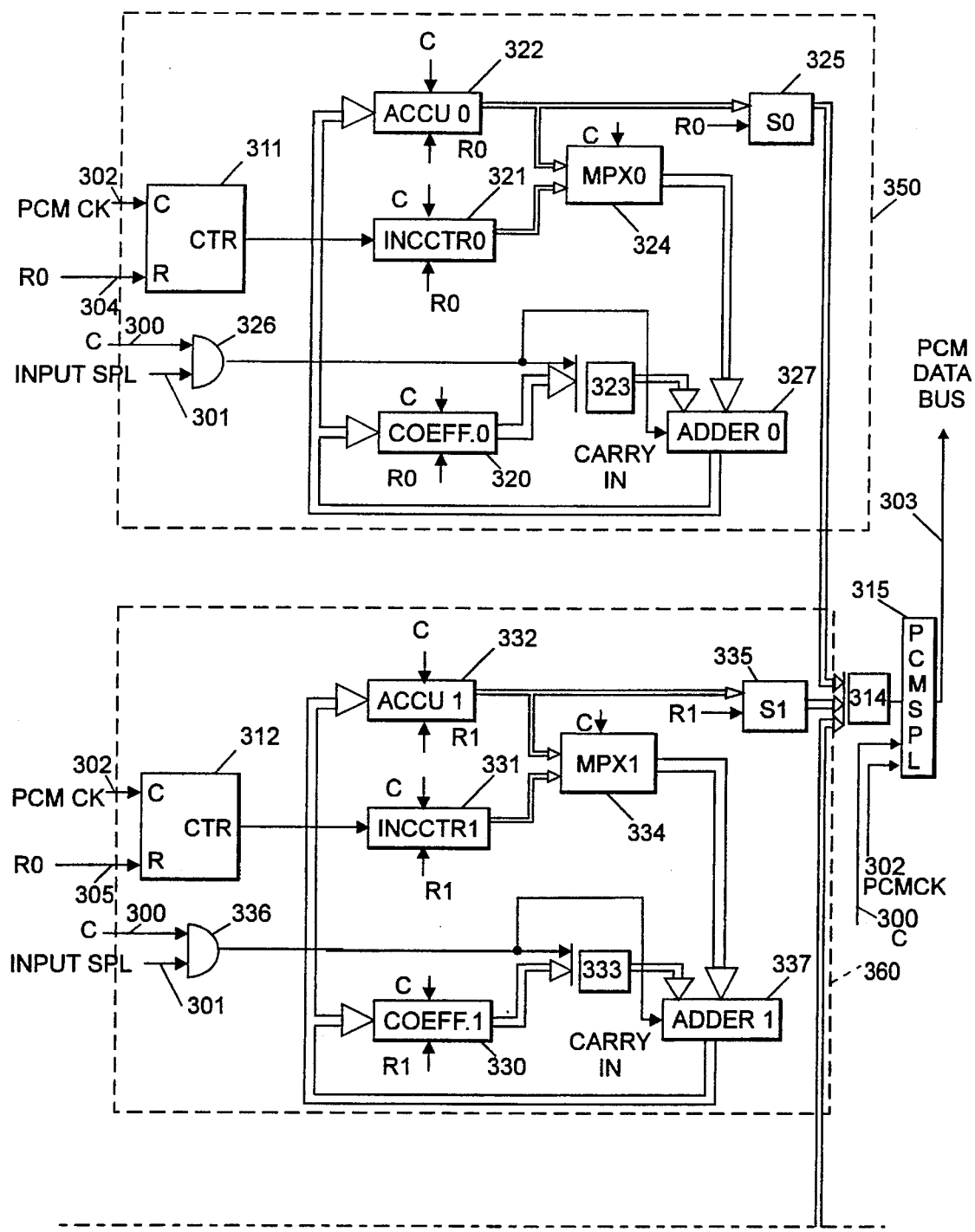
FIG. 3 illustrates the structure of a decimation circuit converting the train of sigma-delta pulses in Pulse Code Modulation (PCM) samples.
Figure 4:
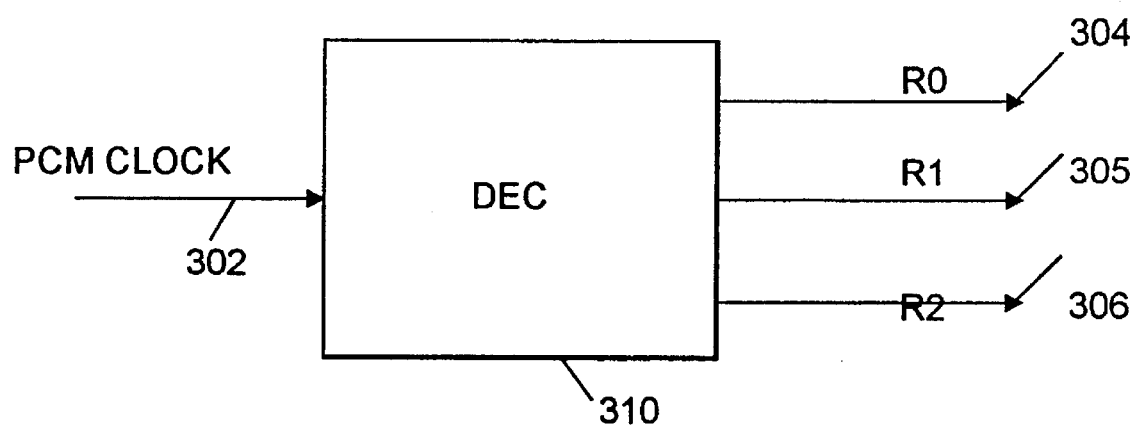
FIG. 4 shows a circuit for the generation of the clock signals which are required in the sigma-delta/PCM conversion process.

With respect to FIG. 3, there is described below the decimation circuit which is used in the preferred embodiment of the invention. This decimation circuit is particularly described in the above mentioned European patent application No. 91480114.4 (now U.S. Pat. No. 5,220,327) which is therein incorporated by simple reference. Briefly, this decimation circuit includes counting means (321, 331, 341) which is driven by the sigma-delta clock and incremented by one during N sigma-delta clock pulses, then decremented by two during N following sigma-delta clock pulses and then incremented again by one during N following sigma-delta clock pulses in order to provide a sequence of incrementation parameter DELTA(n). There is also included storing means (320, 330, 340) for storing the value of a coefficient C(n) corresponding to the decimation filter transfer function, and means driven by the sigma-delta clock for incrementing the storing means with the incrementation parameter DELTA(n). At last, the computing means includes means for deriving from the contents C(n) loaded in the storing means and from the continuous train of coded sigma-delta samples S(i+n) one Pulse Coded Modulation (PCM) sample every 3×N input sigma-delta samples. As explained in the above mentioned patent application, since the coefficients C(n) required for the computation of the PCM sample are directly and on-line computed with the reception of the sigma-delta pulses, a decimation process with a variable decimation factor is easily provided without requiring the use of further digital signal processing resources. More particularly, the decimation filter receives a train of sigma-delta pulses on an INPUT SPL lead 301 and which converts it into PCM words on a PCM data bus 303. To achieve this, the device also receives the oversampling frequency clock fs (C) on a lead 300 and the PCM clock on a lead 302. The computation of one PCM sample is achieved by means of three separate calculations which are respectively performed by three corresponding computation blocks 350, 360 and 370, each computation block computing one PCM sample from a set of 3×N input samples received on lead 301. Because the three computing blocks 350, 360 and 370 are based on a similar structure, fully described in the above mentioned European patent application, only the structure of the first one is fully recalled with all the details. The computing blocks 350, 360 and 370 are respectively driven by a set of three phase-delayed clock R0, R1 and R2 which are generated by a decoding circuit 310 receiving the PCM clock on lead 302 as shown in FIG. 4. Decoding circuit 310 respectively generates the set of three phase-delayed clocks R0, R1, R2 on a set of three leads 304, 405 and 306 at a frequency being the third of the value of the frequency of the PCM clock as shown in the FIGS. 7c, 7d, 7e and 7f accompanying the above mentioned patent application. It should be noticed however that the decoding circuit 310 could be replaced by the circuit described in European patent application No. 91480115.4 which is therein incorporated by reference and which provides a control of the phase of the generation of the PCM samples. The use of the three computing blocks 350, 360 and 370 allows the whole generation of one PCM sample every N input samples S(i) which eventually provides a full down-sampling process with the desired decimation factor N.

The first computing block 350 includes a COEFF0 register 320 for storing the value of the coefficients C(n) which will be used in the filtering and decimation process, the latter register having an input bus connected to a corresponding output bus of an ADDER0 adding circuit 327. Block 350 further includes an ACCU0 accumulator 322 having an input bus connected to the output bus of ADDER0 adding circuit 327. ADDER0 327 is alternatively used for computing the new calculated coefficient and also the partial PCM result: C0×Si+C1×S(i+1)+C2×S(i+2) . . . formed with the train Si of sigma-delta pulses. A counter 311 receives the PCM clock on lead 302 at its clock input and also the R0 clock at its reset input existing on lead 304. Counter 311 generates a control signal for INCCTR0 counter 321 which is used for continuously generating the values of DELTA(i) required for the computation of the series of C(n) coefficients. The update of the contents of counter 321 is performed either by an incrementation of one, or a decrementation of two according to the state of the output of counter 311. The output bus of INCCTR0 counter 321 is connected to a first input bus of a MPX0 multiplexing circuit 324 having a second input bus which is connected to the output bus of accumulator 322. MPX0 multiplexor 324 is controlled by the oversampling clock fs(c) on lead 300. MPX0 multiplexing circuit 324 has an output bus which is connected to a first input bus of an ADDER0 adding circuit 327, which circuit 327 having a second input bus connected to the output bus of a XOR circuit block 323. XOR circuit block 323 is a set of XOR circuits having each a first input which is connected to the output of a AND gate 326 and a second input connected to the corresponding lead of output bus of register 320. AND gate 326 has a first input which receives the oversampling clock fs(c) on lead 300 and a second input receiving the input sample of the train of sigma-delta pulses. The output of AND gate 326 is also connected to the "Carry in" input of the ADDER0. The output of ACCU0 accumulator 322 is connected to the input of gates 325 which transmits the computed PCM sample every 3×N sigma-delta clock pulses at a first input of a set of OR gates. COEFF0 circuit 320, INCCTR0 counter 321, ACCU0 accumulator 322 and gates 325 receive the first R0 clock which is generated by decoding circuit 310 shown in FIG. 4. COEFF0 circuit 320, INCCTR0 counter 321 and ACCU0 accumulator also receives the oversampling clock fs(c) existing on lead 300.

As explained in the above mentioned patent application, the operation of the filtering/decimation circuit is as follows: Considering the first computing block 350: at every clock period of the oversampling clock fs (c) existing on lead 300, counter 321 generates the following element of the sequence DELTA(i) by means of either an incrementation of one or a decrementation of two according to the state of the output of counter 311. Then, the update of the coefficient c(n) is performed in register 320. To achieve this, during the first half of the oversampling clock period fs(c)—ie when the fs clock on lead 300 is at its low level—MPX0 multiplexing circuit 324 transmits the value DELTA(i) carried by the output bus of INCCTR0 counter 321 to the first input bus of ADDER0 circuit 327. The second input bus of ADDER0 circuit 327 receives the contents of COEFF0 register 320 via XOR 323 because the output of AND gate 326 is set to a low level since the oversampling clock fs (c) on lead 300 is also at a low level. Similarly the input Carry in of ADDER0 is at a low level. ADDER0 circuit 327 therefore performs the computation: C(n)=C(n−1)+DELTA(n−1) and the result C(n) is stored into COEFF0 register 320 at the rising edge of the sigma-delta clock period, that is to say at the end of the first half of the sigma-delta clock period. During the second half of the oversampling clock period—ie when the latter clock signal is at a high level —MPX0 multiplexing circuit 324 transmits the contents of ACCU0 accumulator 322 to the first input bus of ADDER0 adding circuit 327 while its second input bus receives the output of XOR gates 323. XOR gate 323 transmits to ADDER0 adding circuit 327 the contents of COEFF0 register 320 or its inverse according to the value of the input sample SPL which is existing on lead 301 during the second half of the oversampling clock period. In the same time, the value of the input sample SPL is presented to ADDER0 Carry in input through AND gate 326.

During that ,second half of the sigma-delta clock period, the input sigma-delta sample S(i+n) on lead 301 is multiplied by the value of the coefficient C(n) stored into register 320 and the result C(n)×S(i+n) is added to the contents of ACCU0 accumulator 322 by ADDER0 adding circuit 327. The result of the latter addition, ie the partial computation of the PCM sample C(0)×S(i)+C(1)×S(i+1)+C(2)×S(i+2)... is loaded into ACCU0 accumulator 322 on the falling edge of the oversampling clock fs(c), ie at the end of the second half of the clock period of the sigma-delta clock fs. INCCTR0 counter 321 is used to continuously generate the sequence DELTA(i) which is needed in the computation of the PCM sample by control block 350, as explained in the above reference patent application, and is controlled by counter 311 as follows: when the output of counter 311 is set to a low level, INCCTR0 counter 321 is incremented by one when the oversampling clock fs(c) on lead 300 switches to a high level. Conversely, when the output of counter 311 is set to a high level, INCCTR0 counter 321 is decremented by two on the rising edge of the oversampling clock period on lead 300. Therefore, INCCTR0 counter 321 stores at every clock period, and more accurately at every half of the oversampling clock period when the latter switches to a high level, the value of DELTA which will be used to update the value of the coefficient needed to compute the PCM sample in accordance with the relation. C(n)=C(n−1)+DELTA(n−1). The latter update of the value of the coefficient C(n) occurs during the first half of the next clock period. R0 clock generated by decoding circuit 310 of FIG. 4 is used to reset the different registers and counters: COEFF0 register 320, INCCTR0 counter 321, and counter 311 are reset when the R0 clock on lead 304 switches to a high level. Conversely, ACCU0 accumulator 322 is reset when the latter R0 clock switches to a low level. Moreover, counter 311 switches at every rising edge of the PCM clock on lead 302. Therefore, when the R0 clock on lead 304 switches to a high level, counter 311 is reset and its output is set to a low level: the INCCTR counter 321 is then incremented by one during a set of N oversampling clock periods. At the next PCM pulse on lead 302, the output of counter 311 switches to a high level and INCCTR0 counter 321 is decremented by two during a set of N oversampling clock period. Similarly, at the next pulse of the PCM clock on lead 302, the output of counter 311 switches again to a low level and INCCTR0 counter 321 is incremented again by one during a set of N oversampling clock periods. At the end of the 3×N consecutive oversampling clock periods, the ACCU0 accumulator 322 is loaded with the value of one PCM sample derived from the sigma-delta pulses according to the formula:

$$\sum_{n=0}^{3N-1} C(n) \times S(i+n)$$

The PCM sample is transmitted to the output of gates at every pulse of the R0 clock and received at the first input of OR gate 314. Since a number of 3×N input samples have been required to generate the PCM output sample which was computed by block 350, the PCM samples generated by block 350 appear at a frequency of fs/3. Computing blocks 360 and 370 operate in a similar fashion but are phase-delayed with respect to the operating of computing block 350. Indeed, block 360 (resp. block 370) is driven by the phase-delayed R1 clock (resp. R2) which is generated by decoding circuit 310 on lead 305 (resp. 306) shown in FIG. 4. The full operations of those additional computing blocks are clearly described in the above mentioned application. Consequently, the set of three computing blocks 350, 360 and 370, each generating one PCM sample every 3×N input sample which is transmitting to one input of OR gate 314, produces a train of PCM samples at a frequency of fs/N. The output of OR gate 314 is connected to the input of a register 315 which provides the series of PCM words on a PCM data bus 303 at the desired fs/N frequency.

Figure 5:
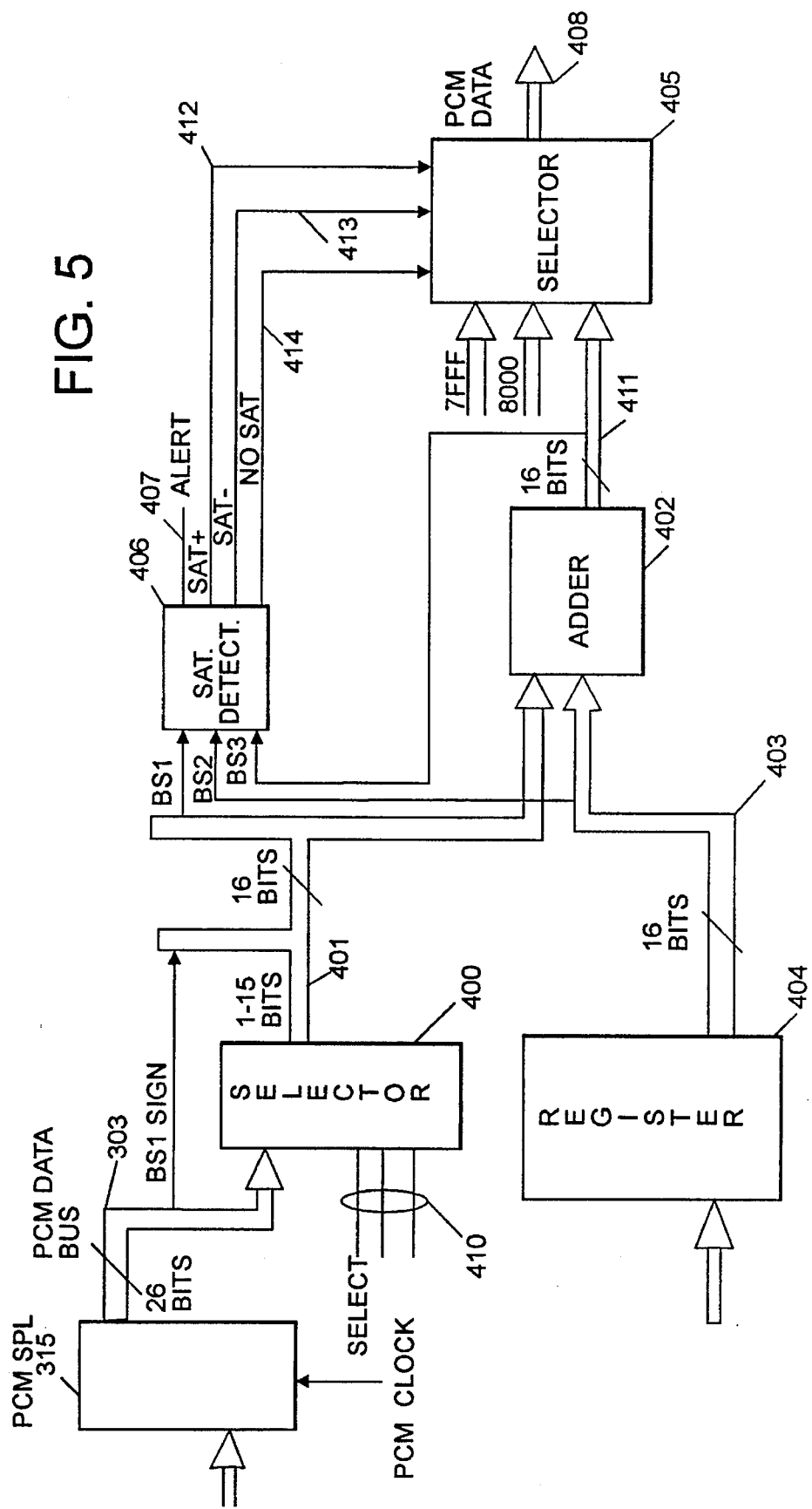
FIG. 5 illustrates the DC suppression mechanism according to the preferred embodiment of the invention for suppressing the DC component into the PCM samples.

As mentioned above, there appears in the sequence of PCM words generated at the output of register 315 a DC component which might disturb the linear digital signal processing operations which will be performed by the DSP (not shown in the figures), for instances carrying out further equalization algorithms, or clock recovery operations in the case of a modem. The DC component is suppressed by means of the additional circuit illustrated in FIG. 5 and which will now be described. Register 315 stores the PCM sample, comprising 26 bits (with a sign bit) in the preferred embodiment of the invention, which appears- on the PCM data bus 303. A selector 400 is used for limiting the length of the PCM word which will be processed so that currently available 16-bits-register can be used for the further processing operations. The output of selector 400 is a bus 401 which is connected to a first input bus of an adding circuit 402, which second input bus 403 is connected to the output of a register 404. The output of adding circuit 402 is connected to the input of a three-ways selector 405 which is controlled by a saturation detector 406 via control signals SAT+oN lead SAT 412, a SAT− on lead 413 and NO SAT on lead 414. According to the values carried by the latter control leads, selector 405 transmits the word existing either on its first input (that is to say word 7FFF representative of the fact that a PCM sample corresponding to a maximum analog value has been decoded), either on its second input (ie word 8000 corresponding to a minimum analog value which has been decoded) or the word existing on bus 411 at the output of adding circuit 402. Saturation circuit 406 also provides the Digital Signal Processor (not shown in the figure) with an ALERT .signal indicating the appearance of a saturation in the converting process. The output of selector 405 generates a train of PCM samples corresponding to the analog signal, from which has been extracted the initial DC component as will be described hereinafter. Register 315 has a length which is designed to correspond to the maximum value of the decimation factor N which is needed. In the preferred embodiment of the invention, bus 303 has 26 bits B1-B25 and BS1, B1 being the least significant bit (LSB), B25 the most significant bit (MSB) and BS1 the sign bit. More generally, the size of PCM SPL register 315 should be chosen so that it permits the storage of N to the third ($N^3$), with N being a desired decimation factor. The DC component is suppressed from the PCM sample as follows: during an initialization period, the digital signal processor (not shown in the figure) controls selector 400 by means of control bus 410 so that to select the most significant bits carried by 26-bit bus 303. This results in a residual 15-bit-bus to which is added the sign bit BS1 of bus 303 in order to constitute a 16-bit-bus 401. The selection of the appropriate 15 bits among the 25 bits of bus 303 is achieved as follows: if the decimation factor N is comprised within 1 and 32, Digital Signal Processor controls selector 400 so that to select bits B1-B15, ie bits B1-B15 are transmitted to the output of selector 400 on bus 401. If however, the decimation factor N has a value comprised within 33 and 50, selector 400 is controlled so that to select bits B3-B17. If the decimation factor N is comprised within 51 and 80, selector 400 selects bits B5-B19. If the decimation factor N is comprised within 81 and 128, then selector 400 selects B7-B21. If the decimation factor N is comprised within 129 and 160, then selector 400 selects B8-B22. If the decimation factor is comprised within 161 and 202, selector 400 selects B9-B23. For a decimation factor comprised within 203 and 256, selector 400 selects B10-B24. At last, for a decimation factor comprised within 257 and 322, selector 400 selects B11-B25. It appears that the selection of the 15 bits among 25 bits progresses from 2 for the low values of the decimation factor (ie for N being inferior to 128) and from 1 for the higher values of the decimation factor N (for N being superior to 128).

Therefore, the 16 most significant bits among the 26 bits of the accumulator are selected. Since the sigma-delta coder provides a maximum accuracy of 15 or 16 bits, the latter selection of 16 MSB does not jeopardize the overall precision of the circuit.

The selection of 15 bits among the 25 bit bus existing on bus 303, to which is added the sign bit also extracted from the PCM data bus 303, permits the use of a standard 16-bit-bus 401. This allows the use of a simple circuitry based on a 16-bits structure (particularly register 404, adding circuit 402, selector 405) while authorizing an accurate DC suppression effect in the decimation process. During an initialization period, the Digital Signal Process first performs a computation in order to determine an average value of the DC component which is introduced in the train of PCM samples. This is achieved as follows:

The mean value of the signal x is computed by means of the following relation:

$$M - \text{Mean value} = \frac{1}{N} \sum_{i=1}^{N} x_i$$

It appears that a high accuracy is provided when the value N is high. In order to get a continuous estimation of the mean value, it is preferable to use the following relation.

$$M_{K+1} = \frac{N-1}{N} M_K + \frac{1}{N} x_k$$

for every new sample $x_k$

After a convergence period, Mk gives an appropriate estimation value.

Figure 7:
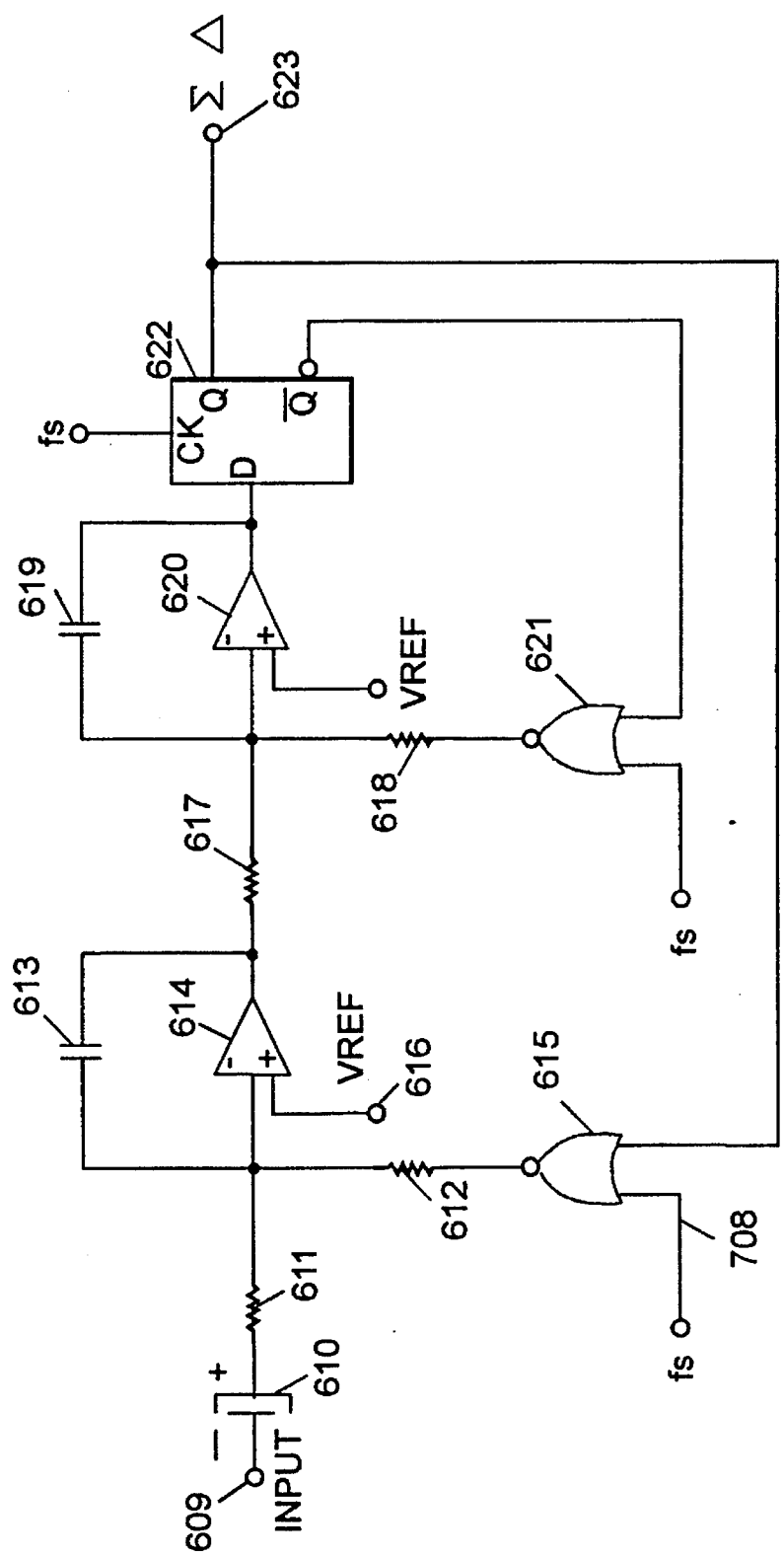
FIG. 7 illustrates a double-loop sigma-delta converter which is used in the preferred embodiment of the invention.

Then, DSP processor loads the inverse of that computed digital value, being coded in 16 bits among which is a sign bit BS3 transmitted to saturation detector 406, into register 404 so that the result of the adding operation performed by adding circuit 402 is a suppression of the estimated DC component value. Then, the initialization period completes and the DSP enters in a second operational phase during which the actual data transmission is allowed. During that second phase, the train of sigma-delta pulses which is-produced at the output of sigma-delta converter, hereinafter described in reference with FIG. 7, is converted by the three parallel computing blocks 350, 360 and 370 of FIG. 3, in order to generate an unique sequence of PCM 26-bits-samples on bus 303 at the rate of fs/N. Correlatively, selector 400 which is under control of the Digital Signal Processor generates a sequence of limited 16-bits-samples (comprising the sign-bit BS1 existing on bus 303) which is transmitted to adding circuit 402 by means of bus 401. Adding circuits generates the result of the DC compensation which is coded in 15 bits plus a sign bit BS3 which is transmitted to Saturation detector 406.

Figure 6:
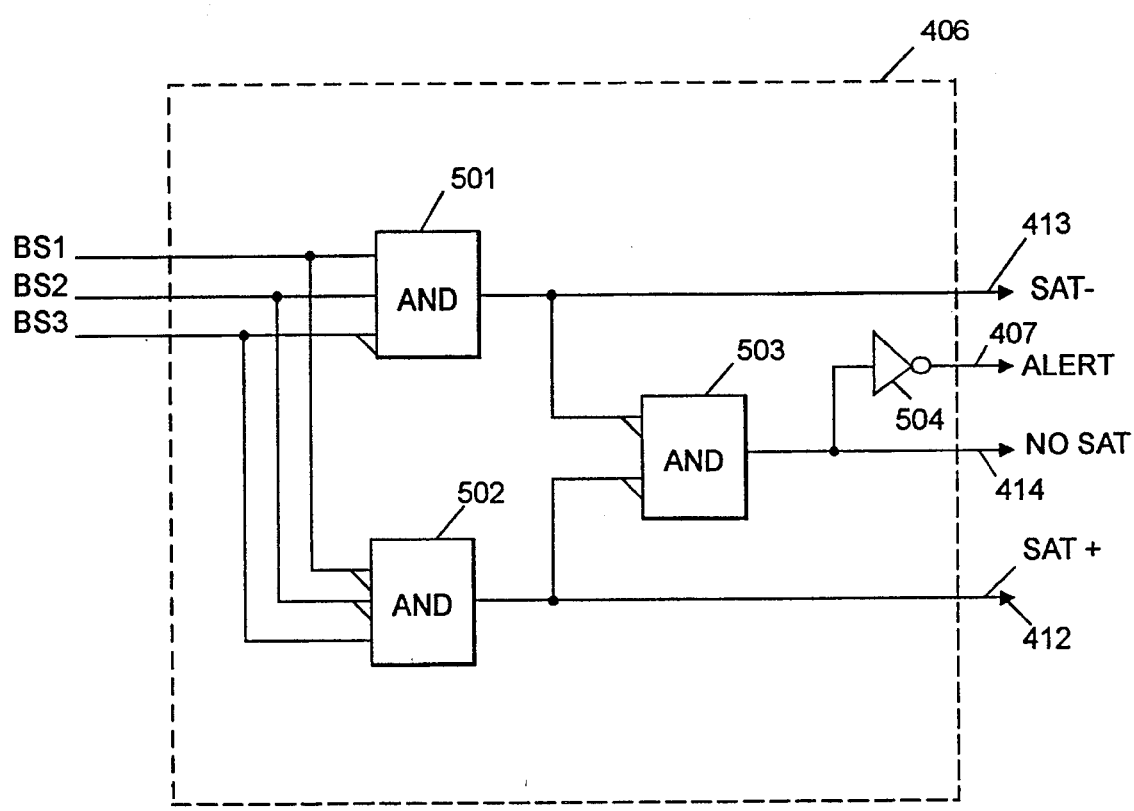
FIG. 6 details the specific saturation circuit 406.

Saturation detector 406 is particularly illustrated in FIG. 6. As shown in the figure that circuit receives the values of BS1, BS2 and BS3 and derives the four following control signals: SAT+ on lead 412, SAT− on lead 413, No_Sat on lead 414 which are transmitted to selector 405 of FIG. 5, and at last an alert control signal on a lead 407 which is transmitted to the Digital Signal processor to inform the latter that a saturation effect has been detected. With respect to FIG. 6, saturation detector 406 comprises an AND gate 501 having a first and second input leads respectively receiving BS1 and BS2 and a third inverting input lead receiving BS3 bit. The output of AND gate 501 generates the SAT− signal on lead 413 and is connected to a first inverting input lead of AND gate 503. Saturation detector 406 further includes a second AND gate 502 having a first and second inverting input leads respectively receiving BS1 and BS2 signals and a third non-inverting input lead receiving BS3 signal. The output of AND gate 502 generates SAT+signal on lead 412 and is also connected to a second inverting input lead of AND gate 503. The output of the latter gate eventually generates NO_Sat signal on lead 414, which, when inverted by means of inverter 504, produces ALERT signal on lead 407 which is transmitted to DSP processor.

With respect to FIG. 5 again, the three control signals SAT−, SAT+ and NO_Sat are received by selector 405 which operates as follows: if NO_Sat signal is at a high level, then the contents of bus 411 is directly transmitted to the output bus 408 of selector 405. If however, SAT+ signal is at a high level, selector 405 transmits the digital value '7FFF' existing on its first input bus to bus 408. At last, if SAT− signal is at a high level, selector 405 transmits the digital value '8000' existing on its second input bus, to output bus 408. Therefore, bus 408 carries a sequence of PCM samples which is not affected by the existence of any DC component and which can be directly processed by processor during the second operational phase. Since the DSP processor is only involved during the first initialization period for computing an estimated value of the DC component which has been introduced into the PCM samples during the coding process, it appears that no digital processing resources from the latter are required during the second operational phase the latter can be fully affected to other processing operations such as echo-cancellation, clock recovery, or equalization procedures.

Referring now to FIG. 7, there is shown the preferred embodiment of the sigma-delta converter used in the A/D converter of the invention and which is based on a double-loop structure. This sigma-delta converter is particularly described in European patent application 91480009.0 entitled "sigma-delta converter", filed on Jan. 17th 1991, assigned to the assignee of the present application and which is therein incorporated by simple reference. With respect to the figure, the DC component existing in the analog signal to be converted on lead 609 is eliminated by means of a capacitor 610. The resulting signal is transmitted to a first lead of a resistor 611 having a second lead respectively connected to the inverting input of an operational amplifier (OA) 614, to a first lead of a resistor 612 and to a first lead of a capacitor 613. The output of the latter operational amplifier is connected to a second lead of capacitor 613 and to a first lead of a resistor 617 having a second lead respectively connected to the inverting input of a second operational amplifier 620, to a first lead of a resistor 618, and to a first lead of a capacitor 619. Operational amplifier 620 has its output lead connected to a second lead of capacitor 619 and to the D-input lead of a D-type latch 622 used as a threshold device. Latch 622 provides at its output leads a sequence of voltages being either equal to 5 volts (or Vcc more generally) or 0 Volt at the rhythm of a fs clock existing at its CK input lead. An example of a circuit for generating the latter fs clock is detailed in the above mentioned European patent application. A reference potential Vref being equal to half the value of the positive supply voltage of latch 622 is transmitted to the non inverting input of OA 614 and 620. The non-inverted Q output lead 623 of D-latch 622 is connected to a first input of a NOR gate 615 of the type 7402 well known to the skilled man having its second input lead receiving the fs sigma-delta clock and also an output lead connected to a second lead of resistor 612. The inverted output lead of latch 622 is connected to a first input of a NOR gate 621 which has its second input also receiving the sigma-delta clock fs and an output lead which is connected to a second lead of resistor 618. It appears that the feedback signal appearing at the output of NOR gate 615 is added to the analog input AC voltage to be converted and then integrated by means of the circuit formed by OA 614, resistors 611 and 612 and capacitor 613. Similarly, the feedback signal appearing at the output of NOR 621 is added to the signal at the output of OA 614 and integrated by means of the circuit based on OA 620, resistors 617 and 618, and capacitor 619. Thus a double-loop structure sigma-delta coder is provided allowing a very high level of signal-to-noise ratio. The output Q of latch 622 provides a train of sigma-delta pulses SPL which are then transmitted to the decimation circuit which has been described above in reference with FIG. 3.

Figure 8:
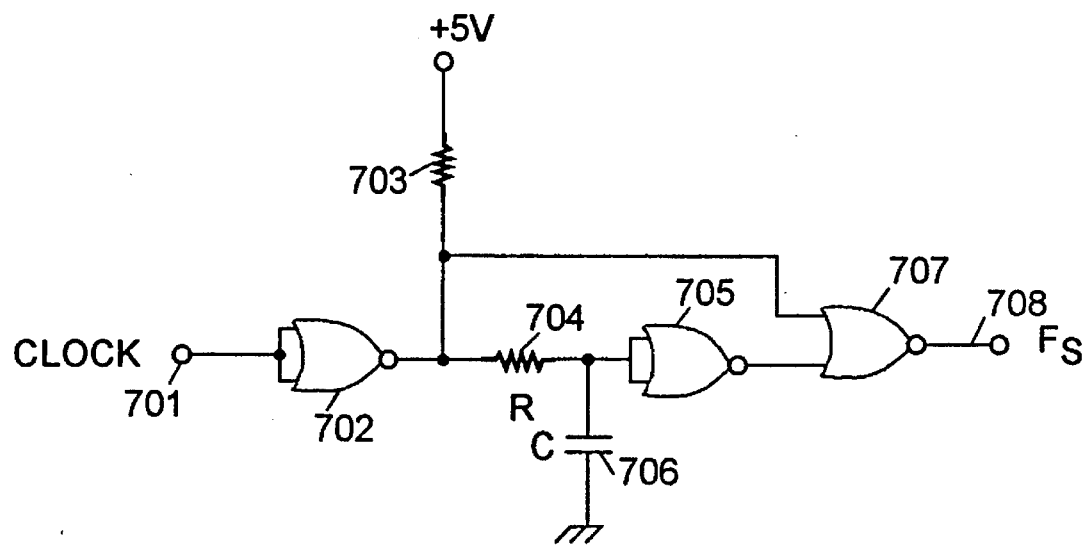
FIG. 8 shows the circuit for generating the fs clock on lead 708.

Referring now to FIG. 8, there is shown how the fs sigma-delta clock is generated. a NOR gate 702, mounted as an inverter, receives at its two input leads the sigma-delta clock signal (c) on lead 300 having the desired sigma-delta frequency value. The output of NOR gate 702 is connected to a first lead of a resistor 704, to a first lead of a resistor 703 having its second lead connected to the voltage supply (5 Volts in the preferred embodiment), and to a first input of a NOR gate 707. Resistor 704 has a second input lead which is connected to a first input of a capacitor 706 having a second lead connected to ground, and to the two input leads of a NOR gate 705, the output of which being connected to a second input of NOR gate 707. The output of NOR gate 707 eventually provides on a lead 308 the required fs clock. As explained in the above mentioned patent application, the use of NOR gates 615= and 621 which are driven at the rate of the fs sigma-delta clock provides a return-to-zero of the sigma-delta code generated at the output of the D__latch 622 at every period of the sigma-delta clock whereby the sigma-delta converter becomes insensitive to the asymmetry of the rise and fall time of the threshold device. This results in an substantial increase of the signal-to-noise ratio.

We claim:

1. A signal converter system comprising a decimation filter means for converting a train of sigma-delta pulses S (i) in synchronism with a sigma-delta clock (fs) into a train of Pulse Coded Modulation (PCM) samples in accordance with the formula $$\sum_{n=0}^{3N-1} C(n) \times S(i+n)$$

where Cn is the sequence of the coefficients of the decimation filter which corresponds to a determined decimation factor, N represents a desired decimation factor, n represents the current element of the series defined by the formula and i represents the current indicia of the element S (i) of the sigma-delta pulse and said PCM samples being processed by a Digital Signal Processor (DSP); and a suppression device characterized in that the suppression device includes:

first means (404) for storing a digital value representative of a DC component introduced during the sigma-delta coding process, said digital value being computed by said Digital Signal Processor (DSP) during an initialization phase, second means (402) operative after an initialization period for receiving and subtracting the stored digital value from each of the said PCM samples to generate a sequence of PCM samples in which the DC component has been suppressed; and, third means (406) for detecting a saturation occurring in the suppressed PCM samples and in response to the detection of a saturation condition, transmitting a predetermined PCM sample to the said Digital Signal Processor (DSP).

2. A signal converter system comprising a decimation filter means for converting a train of sigma-delta pulses S (i) in synchronism with a sigma-delta clock (fs) into a train of Pulse Coded Modulation (PCM) samples in accordance with the formula $$\sum_{n=0}^{3N-1} C(n) \times S(i+n)$$

where Cn is the sequence of the coefficients of the decimation filter which corresponds to a determined decimation factor, N represents a desired decimation factor, n represents the current element of the series defined by the formula and i represents the current indicia of the element S (i) of the sigma-delta pulse and said PCM samples being processed by a Digital Signal Processor (DSP); and a suppression device includes:

first means (404) for storing a digital value representative of a DC component introduced during the sigma-delta coding process, said digital value being computed by said Digital Signal Processor (DSP) during an initialization phase, second means (402) operative after an initialization period for receiving and subtracting the stored digital value from each of the said PCM samples to generate a sequence of PCM samples in which the DC component has been suppressed; and, selector means responsive to the stored digital value, the PCM samples and the DC suppressed PCM signal for inhibiting the output of the said second means when the subtraction of the stored digital value causes the sign of the suppressed PCM value to be different from the signs of both the said PCM value and the said digital value.

3. The signal converter system of claim 1 or 2 wherein the decimation filter includes three computing means (350, 360, 370) arranged in parallel and respectively driven by a set of three phase-delayed clocks derived from said sigma-delta clock (fs), each of said computing means (350, 360, 370) computing one PCM sample from a sequence of 3×N consecutive input sigma-delta pulses.

4. The signal converter system according to claim 3 wherein each of the three computing mean further comprises:

counting means (321, 331, 341) driven by said sigma-delta clock (fs) and is continuously incremented by one during N sigma-delta clock pulses, then decremented again by one during N following sigma-delta clock pulses for generating an incrementation parameter (DELTA(n)), storing means (320, 330, 340) for storing the value of the coefficient C(n) of said decimation filter to be multiplied by the next input sample S(i+n) to be processed, means (327, 337, 347) active every sigma-delta clock period for incrementing said storing means (320, 330, 340) with said incrementation parameter (DELTA(n)), means (323, 337) for deriving from the contents C(n) of said storing means (320, 330, 340) and from train of sigma-delta samples D(i+n) one PCM sample every 3×N input sigma-delta samples.

5. The signal converter system of claim 4 characterized in that said counting means (321, 331, 341) further includes a control lead and performs an incrementation by one when said control lead is at a first logical level and conversely performs a decrementation by two when said control lead is at a second logical level.

6. The signal converter system of claim 4 characterized in that each of said three computing means (350, 360, 370) further includes:

multiplying means (323, 333, 343) connected to said first register (320, 330, 340) and receiving said train of sigma-delta pulses for computing at every period of the sigma-delta clock (fs) the product C(N)×S(i+n), and a second register (322, 332, 342) continuously incremented by the result of said multiplying means.

7. Decimation filter for converting a train of sigma-delta pulses S(i) in synchronism with a sigma-delta clock (fs) into a train of Pulse Coded Modulation (PCM) samples in accordance with the formula $$\sum_{n=0}^{3N-1} C(n) \times S(i+n)$$

where Cn is the sequence of the coefficients of the decimation filter which corresponds to a determined decimation factor N represents a desired decimation factor, n represents the current element of the series defined by the formula and i represents the current indicia of the element S (i) of the sigma-delta pulse and said PCM samples being processed by a Digital Signal Processor (DSP), characterized in that it includes:

means (404) for storing a digital value representative of a DC component introduced during the sigma-delta coding process, said digital value being Computed by said Digital Signal Processor (DSP) during an initialization phase, means (402), coupled to the means which stores the digital value, operating after said initialization phase for subtracting said digital value from each of said PCM samples to generate a resulting sequence of PCM samples in which the DC component has been suppressed, generating means (321, 327, 331, 337, 341, 347) for generating said sequence C(n) corresponding to a determined decimation factor, multiplying means (323, 333, 343), coupled to the generating means for multiplying each coefficient C(n) of said sequence by a sigma-delta input sample S(i+n), means (321, 331 and 341) for detecting the occurrence of the coefficient C(3×N−1) which is equal to zero, and means (311, 312, 313), coupled to the detection means, responsive to the detection of said coefficient C(3×N−1) for shifting of one sigma-delta clock pulse initiating of computing process of the next PCM pulse in order to provide a phase control of the generation of the PCM samples.

8. Decimation filter according to claim 7 characterized in that it further includes three computing means (350, 360, 370) receiving said sigma-delta clock (fs), each of said computing means (350, 360, 370) computing one PCM sample from a sequence of 3×N consecutive input sigma-delta pulses, each of said computing means including:

counting means (321, 331, 341) having a reset lead and control lead (391, 393, 395) for performing either an incrementation by one or a decrementation by two according to the state of said control lead, a first register (320, 330, 340) for storing the value C(n) of the coefficient to be multiplied by a corresponding sigma-delta sample S(i+n), adding means (327, 337, 347) active every sigma-delta clock period for adding the contents of said counting means with the contents of said first register (320, 330, 340) in order to compute the following coefficient to be loaded into said first register, means for respectively generating control and reset signals for said counting means (321, 331, 341) in order to provide in said computing means the generation of the sequence of coefficient C(n) corresponding to said determined decimation factor.

9. Decimation filter according to claim 8 characterized in that it further includes:

means responsive to a determination for shifting of one sigma-delta clock pulse the generation of one PCM clock pulse thereby-transmitting the phase correction to said PCM clock pulse, means for resetting the counting means (321, 331, 341) included into the computing means (350, 360, 370) which has just completed the computation of one PCM sample on the occurrence of said phase correction, means for delaying the synchronization of said control signal of the two computing means (360, 370) which are still in progress until the full completion of the corresponding PCM sample calculation.

* * * * *